United States Patent
Bruening et al.

(10) Patent No.: US 9,164,554 B2
(45) Date of Patent: Oct. 20, 2015

(54) NON-VOLATILE SOLID-STATE STORAGE SYSTEM SUPPORTING HIGH BANDWIDTH AND RANDOM ACCESS

(75) Inventors: Ulrich Bruening, Neustadt (DE); Richard Jordan, Portola Valley, CA (US); Michael J. Koster, Bridgeville, CA (US); Darpan Dinker, Union City, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 0 days.

(21) Appl. No.: 13/084,485

(22) Filed: Apr. 11, 2011

(65) Prior Publication Data

US 2012/0011302 A1     Jan. 12, 2012

Related U.S. Application Data

(60) Provisional application No. 61/323,322, filed on Apr. 12, 2010.

(51) Int. Cl.
| G06F 13/12 | (2006.01) |
| G06F 13/00 | (2006.01) |
| G06F 1/18  | (2006.01) |
| G11C 16/10 | (2006.01) |

(52) U.S. Cl.
CPC ............ *G06F 1/185* (2013.01); *G11C 16/102* (2013.01)

(58) Field of Classification Search
CPC ................................ G06F 13/36; G06F 13/28
USPC .......................................................... 710/62
See application file for complete search history.

(56) References Cited

U.S. PATENT DOCUMENTS

| 4,916,605 A | 4/1990 | Beardsley et al. |
| 5,046,002 A | 9/1991 | Takashi et al. |
| 5,057,996 A | 10/1991 | Cutler et al. |
| 5,117,350 A | 5/1992 | Parrish et al. |
| 5,212,789 A | 5/1993 | Rago |

(Continued)

FOREIGN PATENT DOCUMENTS

| EP | 1548600 B1 | 1/2007 |
| EP | 1746510 A1 | 1/2007 |

OTHER PUBLICATIONS

Ajmani, Automatic Software Upgrades for Distributed Systems, MIT, Sep. 2004, 164 pgs.

(Continued)

*Primary Examiner* — Titus Wong
(74) *Attorney, Agent, or Firm* — Morgan, Lewis & Bockius LLP

(57) ABSTRACT

Approaches for a non-volatile, solid-state storage system that is capable of supporting high bandwidth and/or random read/write access. The storage system may include a chassis having a bus slot and a disk bay, a master card mounted in the bus slot, and a flash memory card stacked in the disk bay and cabled to the master card. The master card enables one or more flash memory cards to be communicatively coupled to a single PCI Express bus. The master card may split a multi-lane PCI Express bus into a plurality of lanes, where one or more of the flash memory cards communicate over each of the plurality of lanes. Alternately, the master card may includes active circuitry for processing, switching, routing, reformatting, and/or converting the PCI Express bus into one or more busses for a plurality of flash memory cards. The stacked flash memory card is not in an enclosure.

17 Claims, 9 Drawing Sheets

(56) References Cited

U.S. PATENT DOCUMENTS

| | | | |
|---|---|---|---|
| 5,287,496 A | 2/1994 | Chen et al. | |
| 5,297,258 A | 3/1994 | Hale et al. | |
| 5,394,555 A | 2/1995 | Hunter et al. | |
| 5,403,639 A | 4/1995 | Belsan et al. | |
| 5,423,037 A | 6/1995 | Hvasshovd | |
| 5,509,134 A | 4/1996 | Fandrich et al. | |
| 5,537,534 A | 7/1996 | Voigt et al. | |
| 5,603,001 A | 2/1997 | Sukegawa et al. | |
| 5,611,057 A * | 3/1997 | Pecone et al. | 710/301 |
| 5,613,071 A | 3/1997 | Rankin et al. | |
| 5,680,579 A | 10/1997 | Young et al. | |
| 5,692,149 A | 11/1997 | Lee | |
| 5,701,480 A | 12/1997 | Raz | |
| 5,742,787 A | 4/1998 | Talreja | |
| 5,887,138 A | 3/1999 | Hagersten et al. | |
| 5,897,661 A | 4/1999 | Baranovsky et al. | |
| 5,897,664 A | 4/1999 | Nesheim et al. | |
| 5,960,436 A | 9/1999 | Chang et al. | |
| 5,963,983 A | 10/1999 | Sakakura et al. | |
| 6,000,006 A | 12/1999 | Bruce et al. | |
| 6,023,745 A | 2/2000 | Lu | |
| 6,052,815 A | 4/2000 | Zook | |
| 6,130,759 A | 10/2000 | Blair | |
| 6,141,692 A | 10/2000 | Loewenstein et al. | |
| 6,151,688 A | 11/2000 | Wipfel et al. | |
| 6,216,126 B1 | 4/2001 | Ronstrom | |
| 6,298,390 B1 | 10/2001 | Matena et al. | |
| 6,308,169 B1 | 10/2001 | Ronstrom et al. | |
| 6,434,144 B1 | 8/2002 | Romanov | |
| 6,467,060 B1 | 10/2002 | Malakapalli et al. | |
| 6,615,313 B2 | 9/2003 | Kato et al. | |
| 6,658,526 B2 | 12/2003 | Nguyen et al. | |
| 6,704,835 B1 | 3/2004 | Garner | |
| 6,728,826 B2 | 4/2004 | Kaki et al. | |
| 6,745,209 B2 | 6/2004 | Holenstein et al. | |
| 6,804,766 B1 | 10/2004 | Noel et al. | |
| 6,874,044 B1 * | 3/2005 | Chou et al. | 710/62 |
| 6,938,084 B2 | 8/2005 | Gamache et al. | |
| 6,944,699 B1 | 9/2005 | Bugnion et al. | |
| 6,981,070 B1 | 12/2005 | Luk et al. | |
| 7,003,586 B1 | 2/2006 | Bailey et al. | |
| 7,010,521 B2 | 3/2006 | Hinshaw et al. | |
| 7,043,621 B2 | 5/2006 | Merchant et al. | |
| 7,082,481 B2 | 7/2006 | Lambrache et al. | |
| 7,162,467 B2 | 1/2007 | Eshleman et al. | |
| 7,200,718 B2 | 4/2007 | Duzett | |
| 7,203,890 B1 | 4/2007 | Normoyle | |
| 7,249,280 B2 | 7/2007 | Lamport et al. | |
| 7,251,749 B1 | 7/2007 | Fong et al. | |
| 7,269,708 B2 | 9/2007 | Ware | |
| 7,269,755 B2 * | 9/2007 | Moshayedi et al. | 714/2 |
| 7,272,605 B1 | 9/2007 | Hinshaw et al. | |
| 7,272,654 B1 | 9/2007 | Brendel | |
| 7,281,160 B2 | 10/2007 | Stewart | |
| 7,305,386 B2 | 12/2007 | Hinshaw et al. | |
| 7,334,154 B2 | 2/2008 | Lorch et al. | |
| 7,359,927 B1 | 4/2008 | Cardente | |
| 7,383,290 B2 | 6/2008 | Mehra et al. | |
| 7,406,487 B1 | 7/2008 | Gupta et al. | |
| 7,415,488 B1 | 8/2008 | Muth et al. | |
| 7,417,992 B2 | 8/2008 | Krishnan | |
| 7,436,771 B2 | 10/2008 | Roberts et al. | |
| 7,467,265 B1 | 12/2008 | Tawri et al. | |
| 7,529,882 B2 | 5/2009 | Wong | |
| 7,542,968 B2 | 6/2009 | Yokomizo et al. | |
| 7,562,162 B2 | 7/2009 | Kreiner et al. | |
| 7,584,222 B1 | 9/2009 | Georgiev | |
| 7,610,445 B1 | 10/2009 | Manus et al. | |
| 7,623,494 B2 | 11/2009 | Zhu et al. | |
| 7,627,618 B2 | 12/2009 | Honigfort | |
| 7,647,449 B1 | 1/2010 | Roy et al. | |
| 7,657,710 B2 | 2/2010 | Loewenstein | |
| 7,809,691 B1 | 10/2010 | Karmarkar et al. | |
| 7,822,711 B1 | 10/2010 | Ranade | |
| 7,885,923 B1 | 2/2011 | Tawri et al. | |
| 7,917,472 B2 | 3/2011 | Persson | |
| 8,015,352 B2 | 9/2011 | Zhang et al. | |
| 8,018,729 B2 * | 9/2011 | Skinner | 361/760 |
| 8,024,515 B2 | 9/2011 | Auerbach et al. | |
| 8,037,349 B2 | 10/2011 | Mandagere et al. | |
| 8,069,328 B2 * | 11/2011 | Pyeon | 711/170 |
| 8,099,391 B1 | 1/2012 | Monckton | |
| 8,103,643 B2 | 1/2012 | Danilov et al. | |
| 8,161,248 B2 | 4/2012 | Blumrich et al. | |
| 8,205,206 B2 | 6/2012 | Özer et al. | |
| 8,225,053 B1 | 7/2012 | McCorkendale et al. | |
| 8,239,617 B1 | 8/2012 | Linnell | |
| 8,261,266 B2 | 9/2012 | Pike et al. | |
| 8,261,289 B2 | 9/2012 | Kasravi et al. | |
| 8,321,450 B2 | 11/2012 | Thatte et al. | |
| 8,335,776 B2 | 12/2012 | Gokhale | |
| 8,356,306 B2 | 1/2013 | Herington | |
| 8,370,853 B2 | 2/2013 | Giampaolo et al. | |
| 8,401,994 B2 | 3/2013 | Hoang et al. | |
| 8,504,526 B2 | 8/2013 | Gokhale et al. | |
| 8,666,939 B2 | 3/2014 | O'Krafka et al. | |
| 8,671,074 B2 | 3/2014 | Wang et al. | |
| 8,683,480 B2 | 3/2014 | Bachar et al. | |
| 2001/0032253 A1 | 10/2001 | Duxbury | |
| 2002/0089933 A1 | 7/2002 | Giroux et al. | |
| 2002/0129192 A1 | 9/2002 | Spiegel et al. | |
| 2002/0166031 A1 | 11/2002 | Chen et al. | |
| 2002/0184239 A1 | 12/2002 | Mosher, Jr. et al. | |
| 2003/0016596 A1 | 1/2003 | Chiquoine et al. | |
| 2003/0097610 A1 | 5/2003 | Hofner | |
| 2003/0177408 A1 | 9/2003 | Fields et al. | |
| 2003/0220985 A1 | 11/2003 | Kawamoto et al. | |
| 2004/0010502 A1 | 1/2004 | Bomfim et al. | |
| 2004/0078379 A1 | 4/2004 | Hinshaw et al. | |
| 2004/0143562 A1 | 7/2004 | Chen et al. | |
| 2004/0148283 A1 | 7/2004 | Harris et al. | |
| 2004/0172494 A1 | 9/2004 | Pettey et al. | |
| 2004/0172577 A1 | 9/2004 | Tan et al. | |
| 2004/0205151 A1 | 10/2004 | Sprigg et al. | |
| 2004/0230862 A1 | 11/2004 | Merchant et al. | |
| 2004/0267835 A1 | 12/2004 | Zwilling et al. | |
| 2005/0005074 A1 | 1/2005 | Landin et al. | |
| 2005/0021565 A1 | 1/2005 | Kapoor et al. | |
| 2005/0027701 A1 | 2/2005 | Zane et al. | |
| 2005/0028134 A1 | 2/2005 | Zane et al. | |
| 2005/0034048 A1 | 2/2005 | Nemawarkar et al. | |
| 2005/0081091 A1 | 4/2005 | Bartfai et al. | |
| 2005/0086413 A1 * | 4/2005 | Lee et al. | 710/313 |
| 2005/0120133 A1 | 6/2005 | Slack-Smith | |
| 2005/0131964 A1 | 6/2005 | Saxena | |
| 2005/0240635 A1 | 10/2005 | Kapoor et al. | |
| 2005/0246487 A1 | 11/2005 | Ergan et al. | |
| 2006/0059428 A1 | 3/2006 | Humphries et al. | |
| 2006/0064549 A1 | 3/2006 | Wintergerst | |
| 2006/0085594 A1 | 4/2006 | Roberson et al. | |
| 2006/0123200 A1 | 6/2006 | Ito et al. | |
| 2006/0130063 A1 | 6/2006 | Kilian et al. | |
| 2006/0161530 A1 | 7/2006 | Biswal et al. | |
| 2006/0174063 A1 | 8/2006 | Soules et al. | |
| 2006/0174069 A1 | 8/2006 | Shaw et al. | |
| 2006/0179083 A1 | 8/2006 | Kulkarni et al. | |
| 2006/0195648 A1 | 8/2006 | Chandrasekaran et al. | |
| 2006/0212795 A1 | 9/2006 | Cottrille et al. | |
| 2006/0218210 A1 | 9/2006 | Sarma et al. | |
| 2006/0242163 A1 | 10/2006 | Miller et al. | |
| 2006/0253724 A1 | 11/2006 | Zhang | |
| 2007/0038814 A1 * | 2/2007 | Purcell et al. | 710/306 |
| 2007/0043790 A1 | 2/2007 | Kryger | |
| 2007/0043860 A1 | 2/2007 | Pabari | |
| 2007/0073896 A1 | 3/2007 | Rothman et al. | |
| 2007/0143368 A1 | 6/2007 | Lundsgaard et al. | |
| 2007/0156842 A1 | 7/2007 | Vermeulen et al. | |
| 2007/0174541 A1 | 7/2007 | Chandrasekaran et al. | |
| 2007/0234182 A1 | 10/2007 | Wickeraad et al. | |
| 2007/0276784 A1 | 11/2007 | Piedmonte | |
| 2007/0283079 A1 | 12/2007 | Iwamura et al. | |
| 2007/0288692 A1 | 12/2007 | Bruce et al. | |
| 2007/0288792 A1 | 12/2007 | Thorpe et al. | |
| 2007/0294564 A1 | 12/2007 | Reddin et al. | |

(56) References Cited

U.S. PATENT DOCUMENTS

| | | | |
|---|---|---|---|
| 2007/0299816 A1 | 12/2007 | Arora et al. | |
| 2008/0016300 A1 | 1/2008 | Yim et al. | |
| 2008/0034076 A1 | 2/2008 | Ishikawa et al. | |
| 2008/0034174 A1 | 2/2008 | Traister et al. | |
| 2008/0034249 A1 | 2/2008 | Husain et al. | |
| 2008/0046538 A1 | 2/2008 | Susarla et al. | |
| 2008/0046638 A1 | 2/2008 | Maheshwari et al. | |
| 2008/0104141 A1 | 5/2008 | McMahon | |
| 2008/0126706 A1 | 5/2008 | Newport et al. | |
| 2008/0172402 A1 | 7/2008 | Birdwell et al. | |
| 2008/0256103 A1 | 10/2008 | Fachan et al. | |
| 2008/0288713 A1 | 11/2008 | Lee et al. | |
| 2008/0288819 A1 | 11/2008 | Heller, Jr. | |
| 2008/0295105 A1 | 11/2008 | Özer et al. | |
| 2008/0301256 A1 | 12/2008 | McWilliams | |
| 2009/0006500 A1 | 1/2009 | Shiozawa et al. | |
| 2009/0006681 A1* | 1/2009 | Hubert et al. | 710/74 |
| 2009/0006888 A1 | 1/2009 | Bernhard et al. | |
| 2009/0019456 A1 | 1/2009 | Saxena et al. | |
| 2009/0024871 A1 | 1/2009 | Emaru et al. | |
| 2009/0030943 A1 | 1/2009 | Kall | |
| 2009/0059539 A1 | 3/2009 | Ryu et al. | |
| 2009/0070530 A1 | 3/2009 | Satoyama et al. | |
| 2009/0150599 A1 | 6/2009 | Bennett | |
| 2009/0177666 A1 | 7/2009 | Kaneda | |
| 2009/0198791 A1 | 8/2009 | Menghnani | |
| 2009/0240664 A1 | 9/2009 | Dinker et al. | |
| 2009/0240869 A1 | 9/2009 | O'Krafka et al. | |
| 2009/0327751 A1 | 12/2009 | Koifman et al. | |
| 2010/0058021 A1 | 3/2010 | Kawamura | |
| 2010/0080057 A1 | 4/2010 | Reuter et al. | |
| 2010/0107017 A1 | 4/2010 | Munjal et al. | |
| 2010/0125695 A1 | 5/2010 | Wu et al. | |
| 2010/0241895 A1 | 9/2010 | Li et al. | |
| 2010/0262762 A1* | 10/2010 | Borchers et al. | 711/103 |
| 2010/0299490 A1 | 11/2010 | Attarde et al. | |
| 2010/0306448 A1 | 12/2010 | Chen et al. | |
| 2010/0318821 A1 | 12/2010 | Kwan et al. | |
| 2010/0325498 A1 | 12/2010 | Nagadomi | |
| 2011/0022566 A1 | 1/2011 | Beaverson et al. | |
| 2011/0072206 A1 | 3/2011 | Ross et al. | |
| 2011/0082965 A1 | 4/2011 | Koka et al. | |
| 2011/0082985 A1 | 4/2011 | Haines et al. | |
| 2011/0099420 A1 | 4/2011 | MacDonald McAlister et al. | |
| 2011/0167038 A1 | 7/2011 | Wang et al. | |
| 2011/0179279 A1 | 7/2011 | Greevenbosch et al. | |
| 2011/0185147 A1 | 7/2011 | Hatfield et al. | |
| 2011/0191299 A1 | 8/2011 | Huynh Huu et al. | |
| 2011/0225214 A1 | 9/2011 | Guo | |
| 2012/0005154 A1 | 1/2012 | George et al. | |
| 2012/0072449 A1 | 3/2012 | Patch et al. | |
| 2013/0066948 A1 | 3/2013 | Colrain et al. | |
| 2013/0198478 A1 | 8/2013 | Bitner | |

OTHER PUBLICATIONS

Amza, Data Replication Strategies for Fault Tolerance and Availability on Commodity Clusters, 2000, 9 pgs.
Rice, Extension Versioning, Update and Compatibility, Aug. 9, 2011, 11 pgs.
Chockler, Active Disk Paxos with infinitely many processes, Springer-Verlag, Apr. 2005, 12 pgs.
Dwork, Concensus in the presence of partial synchrony, MIT, 1988, 6 pgs.
Guerraoui, A Leader Election Protocol for Eventually Synchronous Shared Memory Systems, IEEE, 2006, 6 pgs.
Lamport, Cheap Paxos, Microsoft, 2004, 9 pgs.
Lamport, Fast Paxos, Microsoft, Jul. 2005, 43 pgs.
Lamport, Generalized Consensus and Paxos, Microsoft, Mar. 2004, 25 pgs.
Lamport, Paxos Made Simple, Nov. 2001, 14 pgs.
Malkhi, Lecture notes in computer science [Section: Omega Meets Paxos, Leader election and stability without eventual timely links], 2005, pp. 199-213.
Pease, Reaching Agreement in the Presence of Faults, ACM, 1980, pp. 228-234.
Schneider, Implementing fault tolerant:services using the state machine, Cornell Univ., 1990, 21 pgs.
Mukherjee et al., "Verification of an Industrial CC-NUMA Server," Proceeding of the 15th International Conference on VLSI Design, 2002, 6 pages.
Shacham et al., "Verificaiton of Chip Multiprocessor Memory Systems Using a Relaxed Scoreboard," Microarchitecture, 2008, MICRO-41, 2008, 41st IEEE/ACM International Symposium, Nov. 8-12, 2008, 12 pages.
Unknown Author, Supermicro, "Intel Itanium Processor 9300 Series Based Server Systems," Jul. 8, 2010, http://www.supermicro.com/products/nfo/itanium.cfm, 3 pages.
Walker, Hash Table Tutorial, Oct. 13, 2007, http://www.eternallyconfuzzled.com/tuts/datastructures/jsw_tut_hashtable.aspx, 14 pgs.
bsn-modulestore, Versioning Concept, Oct. 13, 2010, 2 pgs.
Btrfs, http://en.wikipedia.org, Oct. 3, 2011, 9 pgs.
Buchholz, The Structure of the Reiser File System, Jan. 26, 2006, 21 pgs.
Chacon, Git, The Fast Version Control System, Oct. 3, 2011, 3 pgs.
Email Communication from James Bodwin to Christopher Brokaw re prior art, Sep. 13, 2011, 4 pgs.
Git (Software), http://en.wikipedia.org, Oct. 3, 2011, 10 pgs.
Hitz, File System Design for an NFS File Server Appliance, Jan. 19, 1994, 23 pgs.
McDonald, Architectural Semantics for Practical Transactional Memory, Jun. 2006, 12 pgs.
McGonigle, A Short History of btrfs, Aug. 14, 2009, 11 pgs.
Mellor, ZFS—the future of file systems? Aug. 14, 2006, 5 pgs.
Mercurial, http://en.wikipedia.org, Oct. 2, 2011, 6 pages.
Module: Mongoid: Versioning, http://rdoc.info, Documentation by Yard 0.7.2, 6 pages Oct. 3, 2011.
Noach, Database Schema under Version Control, code.openarck.org, Apr. 22, 2010, 6 pages.
Reiser FS, http://enwikipedia.org, Sep. 17, 2011, 5 pgs.
Rice, Toolkit Version Format, Aug. 19, 2011, 4 pgs.
Russell, Track and Record Database Schema Versions, Jun. 28, 2005, 8 pgs.
Schooner Information Technology, IPAF, PCT/US2008/065167, Oct. 23, 2008, 7 pgs.
Schooner Information Technology, ISR/WO, PCT/US2008/065167, Jan 28, 2009, 16 pgs.
SQL Server Database Schema Versioning and Update, Dec. 2, 2009, 2 pgs.
Sufficiently Advanced Bug, File Versioning, Caching and Hashing, Oct. 3, 2011, 3 pgs.
The Z File System (ZFS), FreeBSD Handbook, Oct. 3, 2011, 8 pgs (Author not provided).
Tux3 Linux Filesystem Project, 2008, 1 pg.
Tux3 Versioning Filesystem, Jul. 2008, 67 pgs.
Tux3, http://en.wikipedia.org, Jun. 2, 2010, 3 pgs.
Vijaykumar, Speculative Versioning Cache, Dec. 1, 2001, 13 pgs.
WAFL—Write Anywhere File Layout, 1999, 1 pg.
Write Anywhere File Layout, Sep. 9, 2011, 2 pgs.
ZFS, http://en.wikipedia.org Sep. 30, 2011, 18 pgs.

* cited by examiner

NON-VOLATILE SOLID-STATE STORAGE SYSTEM SUPPORTING HIGH BANDWIDTH AND RANDOM ACCESS

CLAIM OF PRIORITY AND RELATED APPLICATION DATA

The present application claims priority to U.S. provisional patent application 61/323,322, entitled "Non-volatile, solid-state storage system mounted within a processing node," filed on Apr. 12, 2010, and is hereby incorporated by reference for all purposes as if fully set forth herein.

This application is related to U.S. non-provisional patent application Ser. No. 12/983,754, entitled "Efficient Flash Memory-Based Object Store," filed on Jan. 3, 2011, invented by John Busch et al., the entire contents of which are incorporated by reference for all purposes as if fully set forth herein.

This application is related to U.S. non-provisional patent application Ser. No. 12/983,758, entitled "Flexible Way of Specifying Storage Attributes in a Flash-Memory Based Object Store," filed on Jan. 3, 2011, invented by Darryl Ouye et al., the entire contents of which are incorporated by reference for all purposes as if fully set forth herein.

This application is related to U.S. Non-provisional patent application Ser. No. 12/983,762, entitled "Minimizing Write Operations to a Flash Memory-Based Object Store," filed on Jan. 3, 2011, invented by Darpan Dinker, the entire contents of which are incorporated by reference for all purposes as if fully set forth herein.

This application is related to U.S. provisional patent application No. 61/359,237, entitled "Approaches for Replication in a Distributed Transaction System Employing Solid State Devices," filed Jun. 28, 2010, invented by John Busch et al., the entire contents of which are incorporated by reference for all purposes as if fully set forth herein.

FIELD OF THE INVENTION

Embodiments of the invention relate to a non-volatile, solid-state storage system that is capable of supporting high bandwidth and/or random read/write access.

BACKGROUND OF THE INVENTION

Processing nodes may be used to perform a variety of computational work. The composition of a processing node may include one or more of the following: one or more processors, memory (such as Dynamic Random Access Memory (DRAM) for example), one or more chips providing connectivity to the processors (such as Northbridge chips and/or Southbridge chips for example), one or more disk bays enabled to hold a respective disk (such as a 2.5" or 3.5" AT-compatible or SAT Compatible disk for example), peripherals (such as LEDs, microphones, speakers, and DVD drives), peripheral interfaces (such as USB slots), Input/Output (I/O) connections (such as Ethernet or RS-232 connections), and peripheral busses (such as a PCI bus and a PCI Express bus).

Some disk storage interfaces, such as the AT, ATA, SATA for example, are restrictive in bandwidth and/or capabilities. For example, AT and/or SATA disk interfaces are designed for block based transfers and are not optimized for random access.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for a non-volatile, solid-state storage system that is capable of supporting high bandwidth and/or random read/write access are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Techniques for designing, mounting, and fabricating a non-volatile, solid-state storage system are described. The non-volatile, solid-state storage system includes non-volatile memory, such as flash memory, for the persistent storage of data. According to various embodiments, the non-volatile, solid-state storage system interfaces uses one or more of: a high-speed, point-to-point interconnect, a PCI or PCI Express bus, a HyperTransport™ link (developed by the HyperTransport Consortium), and any similar bus or communication link. In some embodiments, the non-volatile, solid-state storage system uses disk slots (such as disk bays of a rack-mounted computer system) to hold one or more printed circuit boards (PCBs) containing at least a portion of the non-volatile, solid-state storage system. In various embodiments, the non-volatile, solid-state storage system is designed to support high bandwidth and/or provide for random access.

Figure 1:
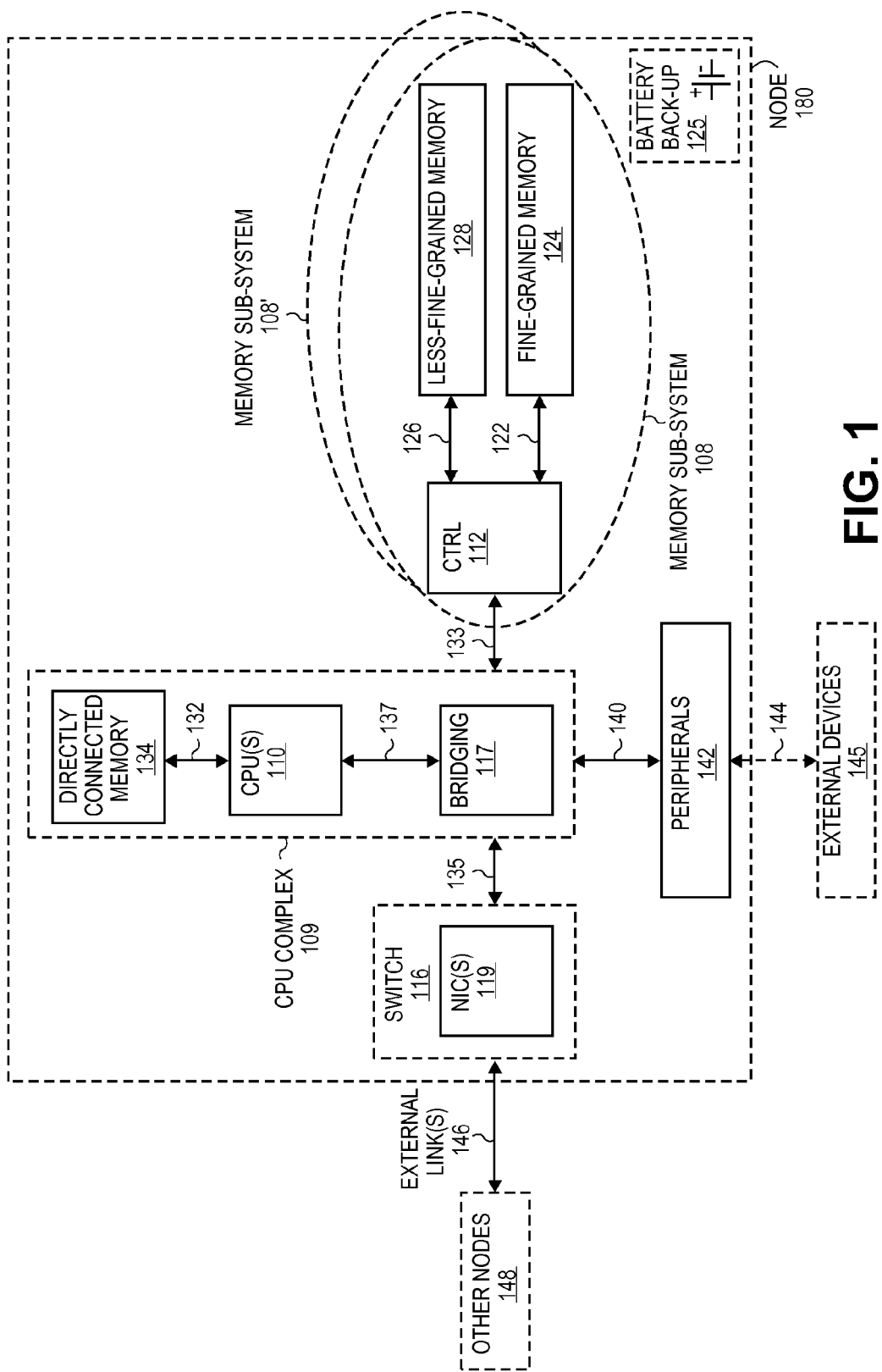
FIG. 1 is an illustration of a processing node according to an embodiment of the invention.

FIG. 1 illustrates processing node (180) according to an embodiment of the invention. The processing node includes one or more memory sub-systems (108, 108'). In various embodiments, the non-volatile, solid-state storage system includes the one or more memory sub-systems and optionally may include a battery back-up (125). The memory sub-systems include a memory sub-system controller (112) coupled to less-fine-grained memory 128 (such as flash memory) and optional fine-grained memory 124 (such as Dynamic Random Access Memory (DRAM)). Memory sub-system 108 is illustrated in further detail in FIG. 2A, and memory subsystem controller 112 is illustrated in further detail in FIG. 2B. In some embodiments, memory sub-system controller 112 is and/or includes an application specific integrated circuit (ASIC) and/or a field-programmable gate array (FPGA). In various embodiments, less-fine-grained memory 128 is a nonvolatile memory, such as flash memory. In further embodiments, less-fine-grained memory 128 is a page-based memory, such as NAND flash memory. As used herein, without limitation, the less-fine-grained memory is sometimes referred to as flash memory.

The processing node also includes a CPU complex (109) to execute software to control and/or to manage the processing node and to run application programs. The application programs, in some embodiments, advantageously use storage in the less-fine-grained memory 128. The processing node optionally includes peripheral devices (142) and/or connectivity to external devices (145). According to various embodiments, the software executed by the CPU complex is persistently stored in one or more of: a boot PROM or other non-volatile memory on a motherboard of the rack-mounted computer system, peripherals 142 (such as a PCMCIA card), external devices 145 (such as a hard disk drive in a disk bay), and less-fine-grained memory 128. The CPU complex includes CPU(s) 110, directly connected memory 134 coupled to the CPU(s) and serving, at least in part, as main memory of the CPU(s), and bridging 117 serving, at least in part, as external connectivity of the processors (such as a Northbridge and/or a Southbridge chip).

The processing node also may optionally includes switch 116 (including Network Interface Controller(s) 119) providing connectivity to other processing nodes (such as via external link(s) 146 to other nodes 148).

In order to provide a high-speed interface between processors and the non-volatile, solid-state storage system, a higher-performance and/or more flexible interface (as compared to some disk storage interfaces such as AT, ATA, and/or SATA) is used. For example, a PCI Express interface (and accordingly, a PCI Express bus) is used by certain embodiments, providing high bandwidths and a protocol suitable for both small (such as 64B) and large (such as many KB) data transfers. Using a PCI Express bus (or a similar bus) to communicate between the processors and the non-volatile, solid-state storage system provides an interface that is more optimized for accessing a high-speed, random-access memory. In various other embodiments, other busses and/or communications links, such as HyperTransport™ or InfiniBand®, may be used.

An issue in some rack-mounted computer systems is a lack of sufficient space, both on a motherboard and/or volumetrically in a chassis of the rack-mounted computer system. For example, some rack-mounted computer systems have a limitation as to a number of cards that can be plugged into a PCI (or PCI Express) bus on the motherboard, such as only having two PCI Express slots or connectors on the motherboard. Further, in some rack-mounted computer systems, the PCI Express slots have restrictions in card height and/or length. This limits the ability to provide the non-volatile, solid-state storage system (and/or to provide the non-volatile, solid-state storage system with a desired size) solely using the PCI Express bus slots.

To avoid the number and/or space limitations of the PCI Express slots, in some embodiments, the non-volatile, solid-state storage system uses physical space in the rack-mounted computer system that is intended for holding a disk drive. This physical space is termed a disk bay. A cable connects a master card (such as card 393 as illustrated in FIG. 2C or FIG. 2D) that is installed in one of the PCI Express slots on the motherboard to one or more flash memory cards in one or more of the disk bays. In various embodiments, the flash memory cards are same as or similar to memory subsystem 108 and include a controller (such as memory sub-system controller 112), a less fine-grained memory (such as less-fine-grained memory 128), and optionally a fine grained memory (such as fine-grained memory 124; of course, in various embodiments, the flash memory cards include any type or types of non-volatile memory, and calling these cards flash memory cards is not intended to be limiting).

The cable acts, for example, as a PCI Express extender cable and couples the flash memory cards to the PCI Express bus. In some embodiments, the PCI Express bus is represented, at least in part, via 133 as illustrated in FIGS. 1, 2C, and 2D, and the cable is represented as 133' as illustrated in FIGS. 2A, 2B, 2C, and 2D. Each of the disk bays is capable of holding one or more of the flash memory cards. In some embodiments, the one or more flash memory cards are arranged in a stack in the disk bay and do not have an enclosure. A disk drive or a PCMCIA card have metal or plastic enclosures, such as a case that fully encloses circuitry of the disk drive or PCMCIA card, except for external connections and air ventilation. For example, in various embodiments, there are three flash memory cards stacked in one of the disk bays. In certain embodiments, the stacked flash memory cards are mounted in a flash caddy (such as illustrated in FIG. 3) which is installable in a disk bay.

In some embodiments, each of the flash memory cards is independently cabled to the master card. In other embodiments, a first group of one or more of the flash memory cards is cabled to the master card, and others of the flash memory cards are daisy chained to the first group of the flash memory cards. For example, in various embodiments, a first flash memory card in each of the disk bays holding the flash memory cards is cabled to the master card, and others of the flash memory cards in the disk bay are daisy chained to the first flash memory card. The flash memory cards that are not directly cabled to the master card are still visible and accessible on the PCI Express bus via a daisy chain connection (FIG. 2B illustrates one example of daisy chain connections (331 and 335) between flash memory cards). In some embodiments, the daisy chain connection forms a switched network among the flash memory cards. According to various embodiments, the daisy chain connection is configurable (for example, in a number of lanes and/or in bandwidth) and/or fault-tolerant.

Figure 2A:
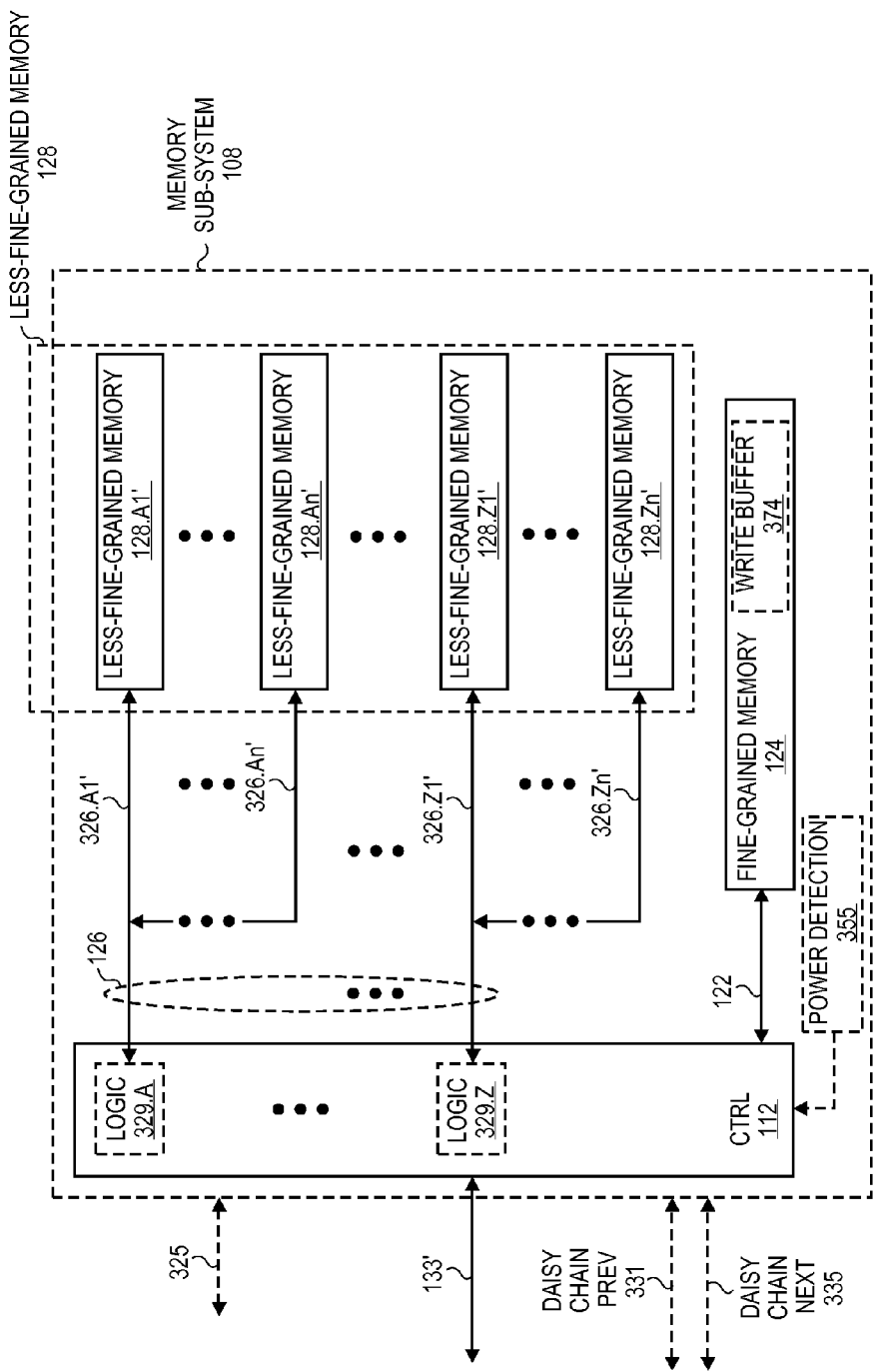
FIG. 2A is an illustration of a memory sub-system according to an embodiment of the invention.
Figure 2B:
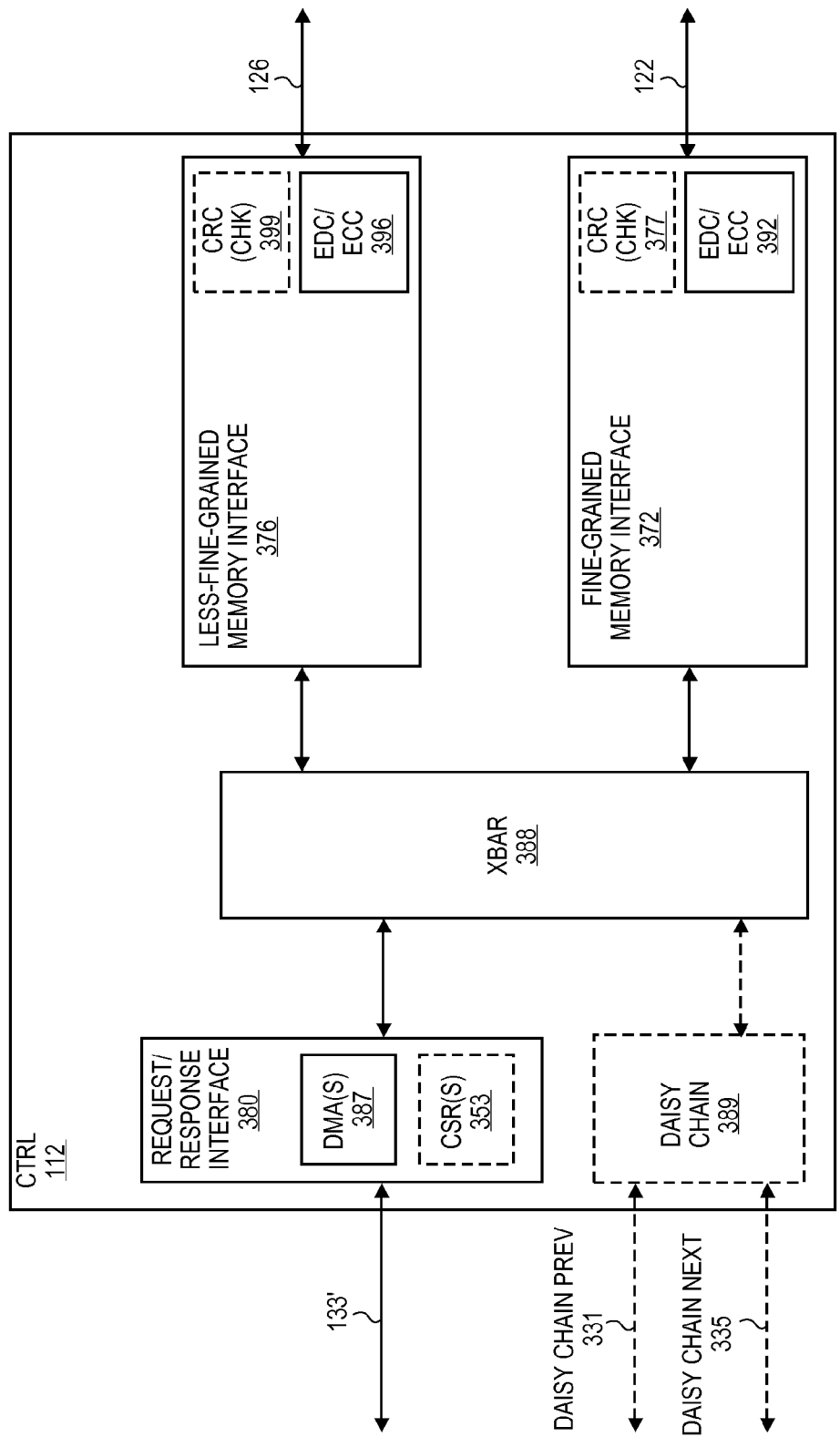
FIG. 2B is an illustration of memory sub-system controller according to an embodiment of the invention.
Figure 2D:
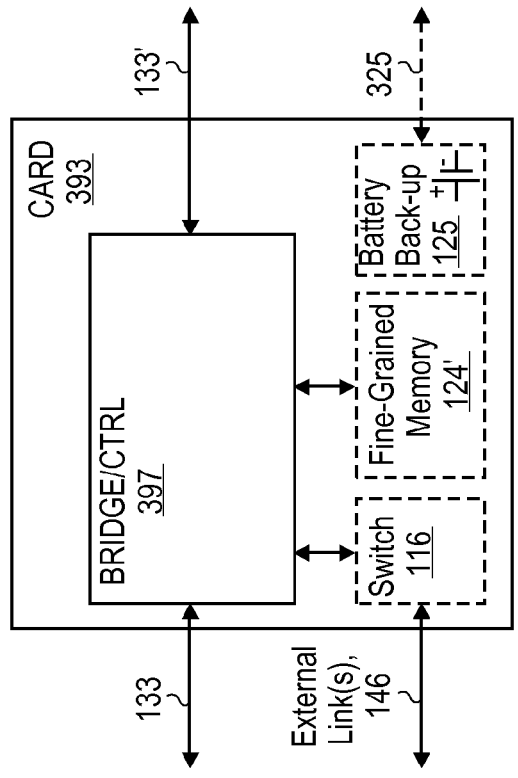
FIG. 2D is an illustration of a master card according to another embodiment of the invention.
Figure 2C:
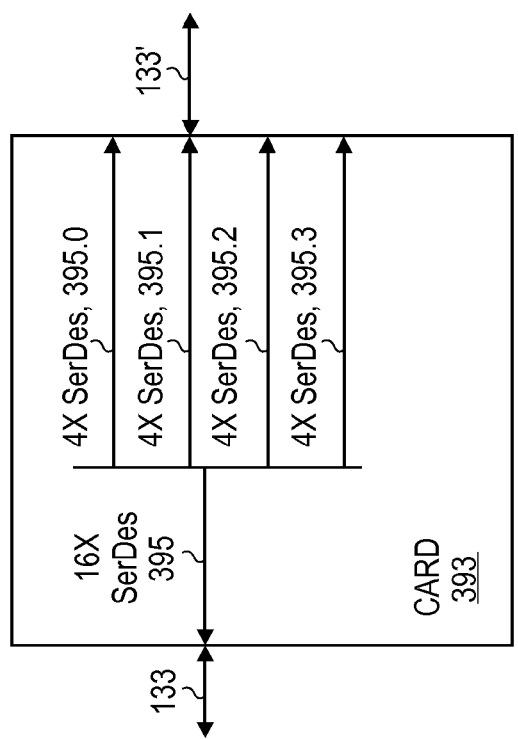
FIG. 2C is an illustration of a master card according to one embodiment of the invention.
Figure 3:
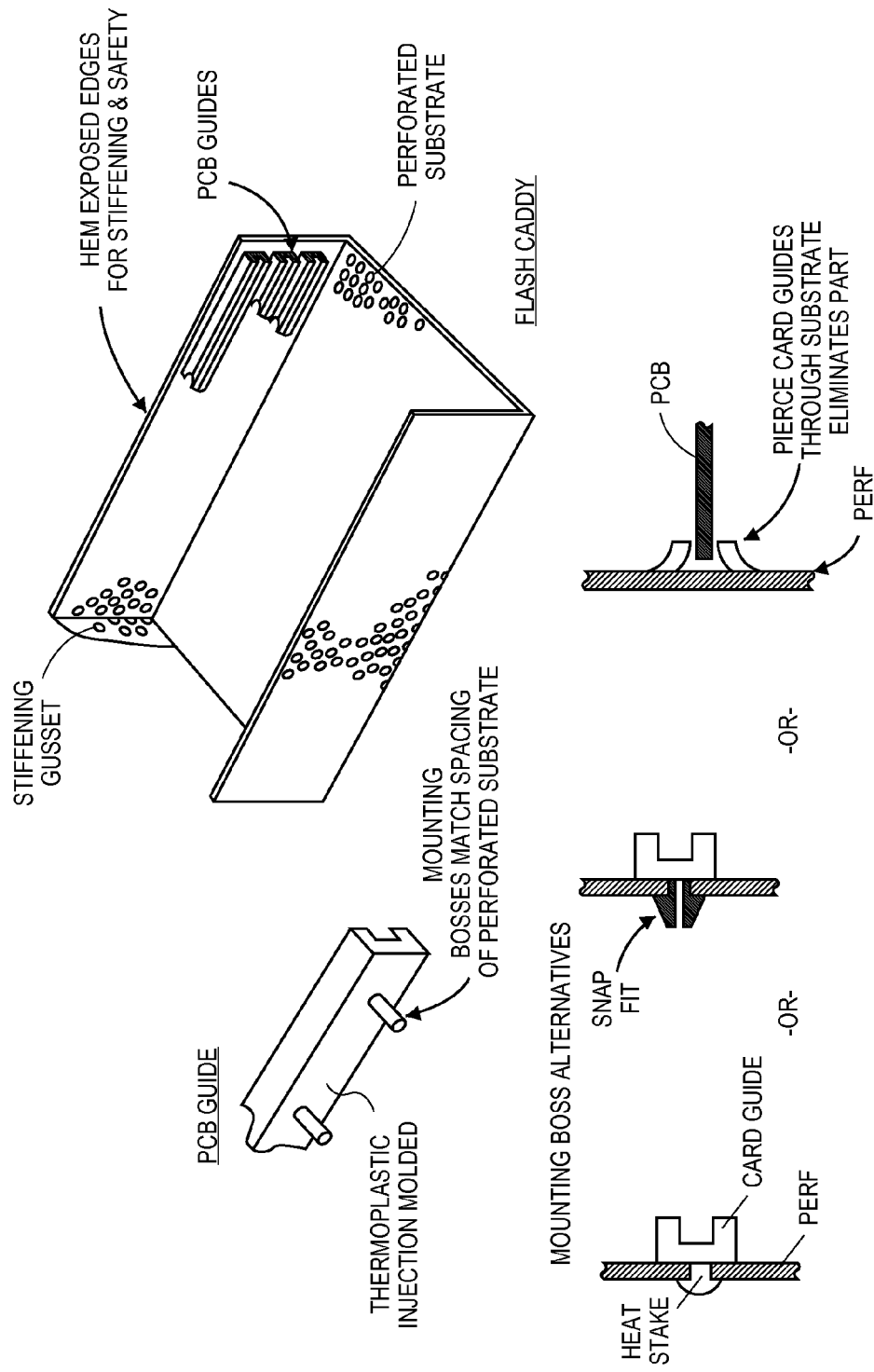
FIG. 3 is an illustration of a flash caddy for one or more NVM PCBs according to an embodiment of the invention.

In some embodiments, the master card and/or the flash memory cards are coupled in a hierarchical structure enabling a plurality of sub-controllers of flash memory chips and/or banks (such as logic 329.A, . . . , 329.Z as illustrated in FIG. 2A) on one or more flash memory cards to be accessed from as few as one PCI Express bus slot.

In an embodiment, the master card is a physical component that enables one or more flash memory cards to be communicatively coupled to a single PCI Express bus. In some embodiments, the master card (393 as illustrated in FIG. 2C) is passive, and, for example, just splits a multi-lane PCI Express bus (133) into sets of lanes (such as 133') for one or more of the flash memory cards. In other embodiments, the master card is active (as illustrated in FIG. 2D) and includes active circuitry for one or more of processing, switching, routing, reformatting, and converting the PCI Express bus (133) into one or more busses (such as 133') for the flash memory cards (the converted busses are optionally a different protocol and/or a different bandwidth than the PCI Express bus). If the master card is active, then the master card optionally includes circuitry for controlling and/or managing the flash memory cards.

In some embodiments, a battery back-up system (such as battery back-up 125 as illustrated in FIG. 1) is also located in the rack-mounted computer system. For example, the battery back-up system may be located in one of the disk bays, either separately from or in addition to one or more of the flash memory cards. In various embodiments, the battery back-up system replaces one of the flash memory cards. The battery back-up system is used to provide power to some or all of the non-volatile, solid-state storage system in the event of a power disruption to the rack-mounted computer system. According to various embodiments, the battery back-up system powers one or more of: (a) the flash memory cards in a same disk bay as the battery back-up system, (b) flash memory cards in any of the disk bays, and (c) any cards in the rack-mounted computer system, such as a portion of the non-volatile, solid-state storage system connected via a PCI Express slot (for example, the master card). Switching from normal power to power from the battery back-up system is done, in various embodiments, at various places, including but not limited to a backplane, at one or each of the flash memory cards, and at the master card. In some embodiments, the switching is a distributed and/or independent switching on each of the flash memory cards.

In some embodiments, a non-volatile, solid-state storage system comprises one or more non-volatile, solid-state memory (such as flash memory) printed circuit boards (NVM PCBs). In some embodiments, the NVM PCBs are flash memory cards. In various embodiments, the NVM PCBs are the same as or similar to memory sub-system 108 (as illustrated in FIG. 1 and FIG. 2A) and include a controller (such as memory subsystem controller 112), a less-tine-grained memory (such as less-fine-grained memory 128), and optionally a fine-grained memory (such as fine-grained memory 124).

The NVM PCBs are coupled to a PCI Express bus (or to a similar bus or communication link in a processing node). Across various embodiments, NVM PCBs may be implemented differently. To illustrate, the NVM PCBs may each coupled independently to the PCI Express bus, such as via a card on the PCI Express bus (such as card 393 as illustrated in FIG. 2C or FIG. 2D). Alternately, the NVM PCBs may be coupled together, such as in a daisy chain, with one or more of the NVM PCBs coupled to the PCI Express bus, such as via a card on the PCI Express bus, and zero or more of the NVM PCBs indirectly coupled to the PCI Express bus by coupling to another of the NVM PCBs. In other embodiments, the NVM PCBs may be each coupled to a backplane, where connectivity to the PCI Express bus, such as via a card on the PCI Express bus, is via the backplane. Alternately, the NVM PCBs may each be coupled to a backplane, where the backplane is and/or includes a card on the PCI Express bus.

According to various embodiments, the NVM PCBs are mounted in various fashions. To illustrate, in an embodiment, the NVM PCBs may be mounted one in a stack, such as a stack using mechanical spacers or electrical spacers (such as inter-board connectors). In other embodiments, the NVM PCBs may be mounted in a flash caddy, such as a caddy having, for each of the NVM PCBs, a respective one or more PCB guides.

According to various embodiments, the NVM PCBs are one or more of: a factory-replaceable unit; a field-replaceable unit; and a hot-swappable unit.

Figure 6:
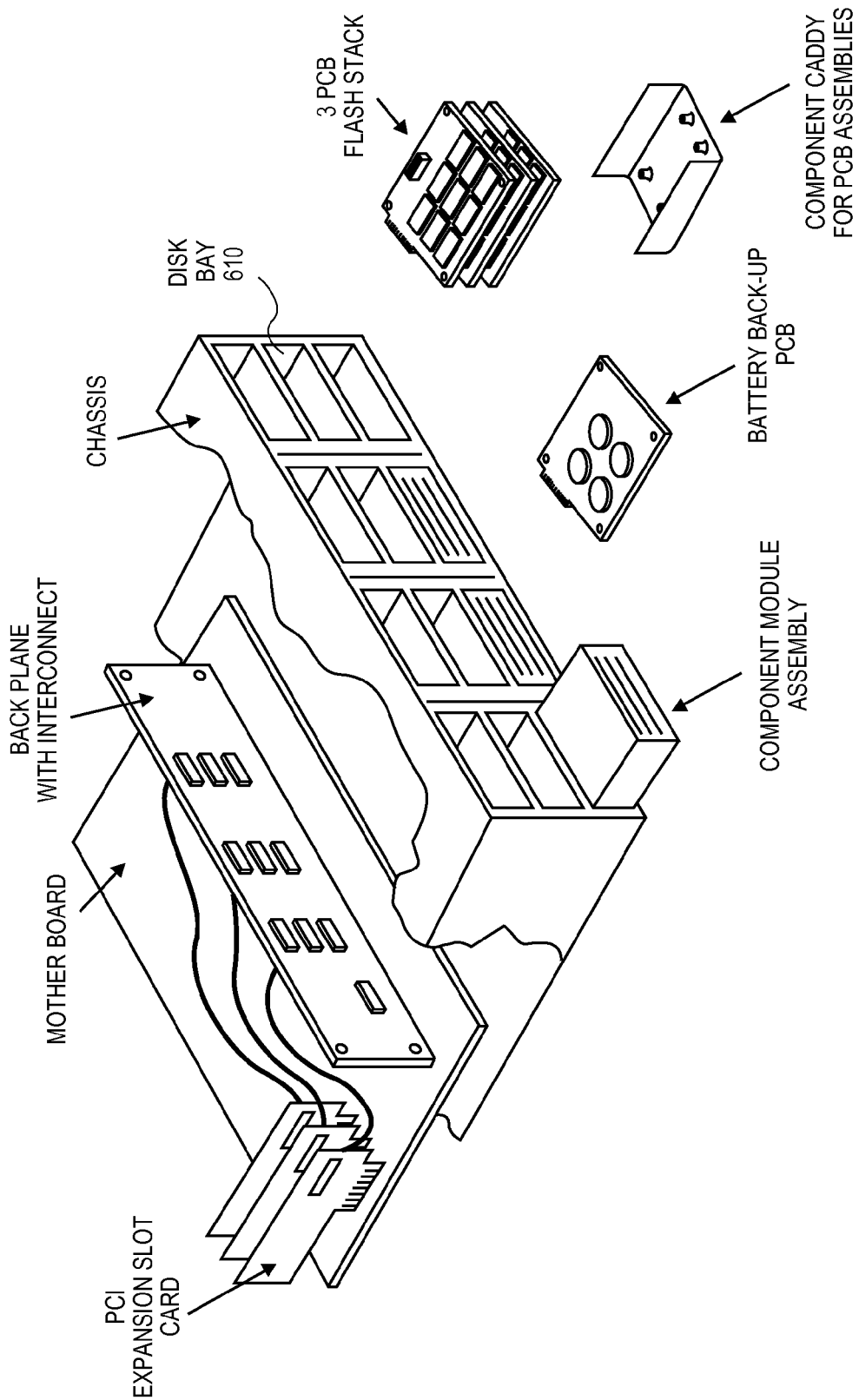
FIG. 6 is an illustration of a rack-mounted chassis including a plurality of disk bays according to an embodiment of the invention.
Figure 7:
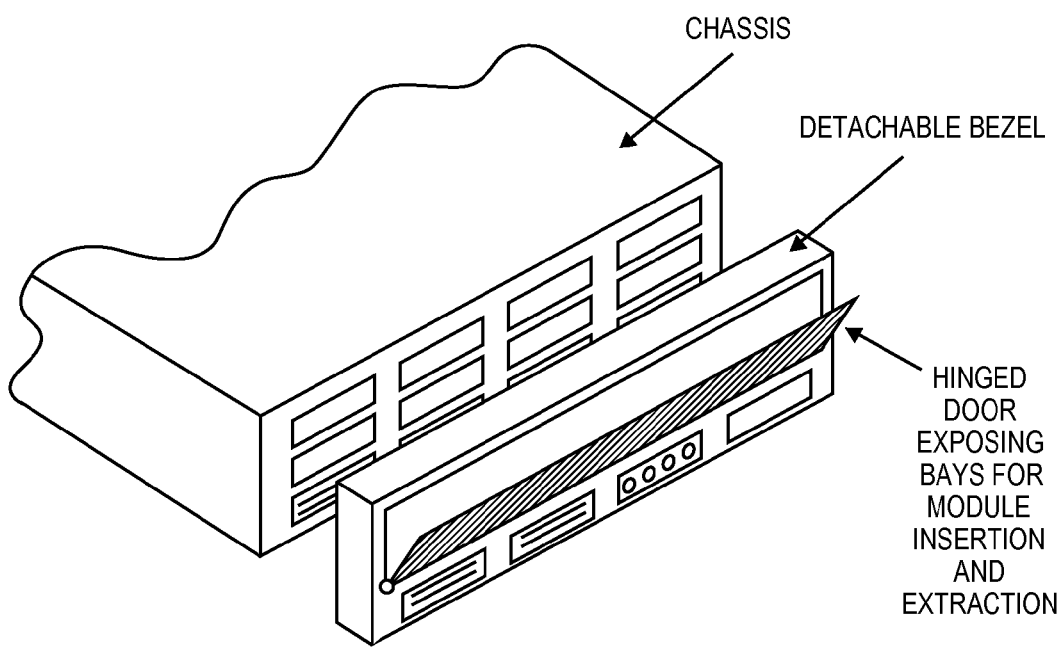
FIG. 7 is an illustration of the accessibility of a plurality of disk bays in a rack-mounted chassis according to an embodiment of the invention.

In some embodiments, a chassis (such as a rack-mounted chassis) includes one or more disk bays (such as disk bay 610 as illustrated in FIG. 6), and optionally houses a processing node. In various embodiments, one or more of the NVM PCBs are mounted in one or more of the disk bays of the chassis. In further embodiments, at least some of the disk bays are accessible from a front of the chassis, such as via a hinged (or sliding, or otherwise movable or removable) front panel. For example, as illustrated in FIG. 7, a hinged door (C in FIG. 7) provides access to a number of the disk bays, such as a proper subset of the disk bays. Accessing the proper subset of the disk bays via the front of the chassis enables, in some embodiments, removal and/or insertion, including hot-swapping, of ones of the NVM PCBs mounted in the proper subset of the disk bays. In various embodiments, the chassis may have any number of disk bays, such as one, two, four, eight, or twelve disk bays. In further embodiments, less than all of the disk bays are accessible from the front of the chassis, such as due to restrictions imposed by a design of the front panel.

In some embodiments, a battery back-up system is mounted in one or more of the disk bays. According to various embodiments, the battery back-up system (illustrated by G in FIG. 6 or 125 in FIG. 1) may be one or more of: (a) a factory-replaceable unit, (b) a field-replaceable unit, (c) a hot-swappable unit, (d) accessible from a front of the chassis, such as via a hinged (or sliding, or otherwise movable or removable) front panel, (e) used to provide back-up power to a card on the PCI Express bus, such as the card to which one or more of the NVM PCBs are coupled, (f) used to provide back-up power to one or more of the NVM PCBs, (g) coupled to the one or more NVM PCBs via one or more respective connectors, (h) coupled to the one or more NVM PCBs via a backplane, (i) coupled to the one or more NVM PCBs via a card on the PCI Express bus, such as the card to which one or more of the NVM PCBs are coupled, (j) mounted within the chassis, (k) substantially similar in mounting configuration to the NVM PCBs, and (l) substantially similar in mounting configuration to a flash caddy of the NVM PCBs.

FIG. 3 illustrates an example of using sheet metal, such as formed, perforated sheet metal, to act as a flash caddy for one or more NVM PCBs. Naturally occurring holes in the perforated sheet metal are used for one or more purposes, such as the venting of heat, holes for attaching PCB guides for sliding the NVM PCBs into and out of the assembly, and attachment of the PCB guides to the perforated sheet metal via one or more techniques (for example, by heat staking, ultrasonic deformation, snap fit, screws, and other mechanical fasteners).

In some embodiments, another technique that eliminates parts in the flash caddy (and reduces associated costs) is to make piercings, as illustrated in the lower right hand corner of FIG. 3.

Figure 4:
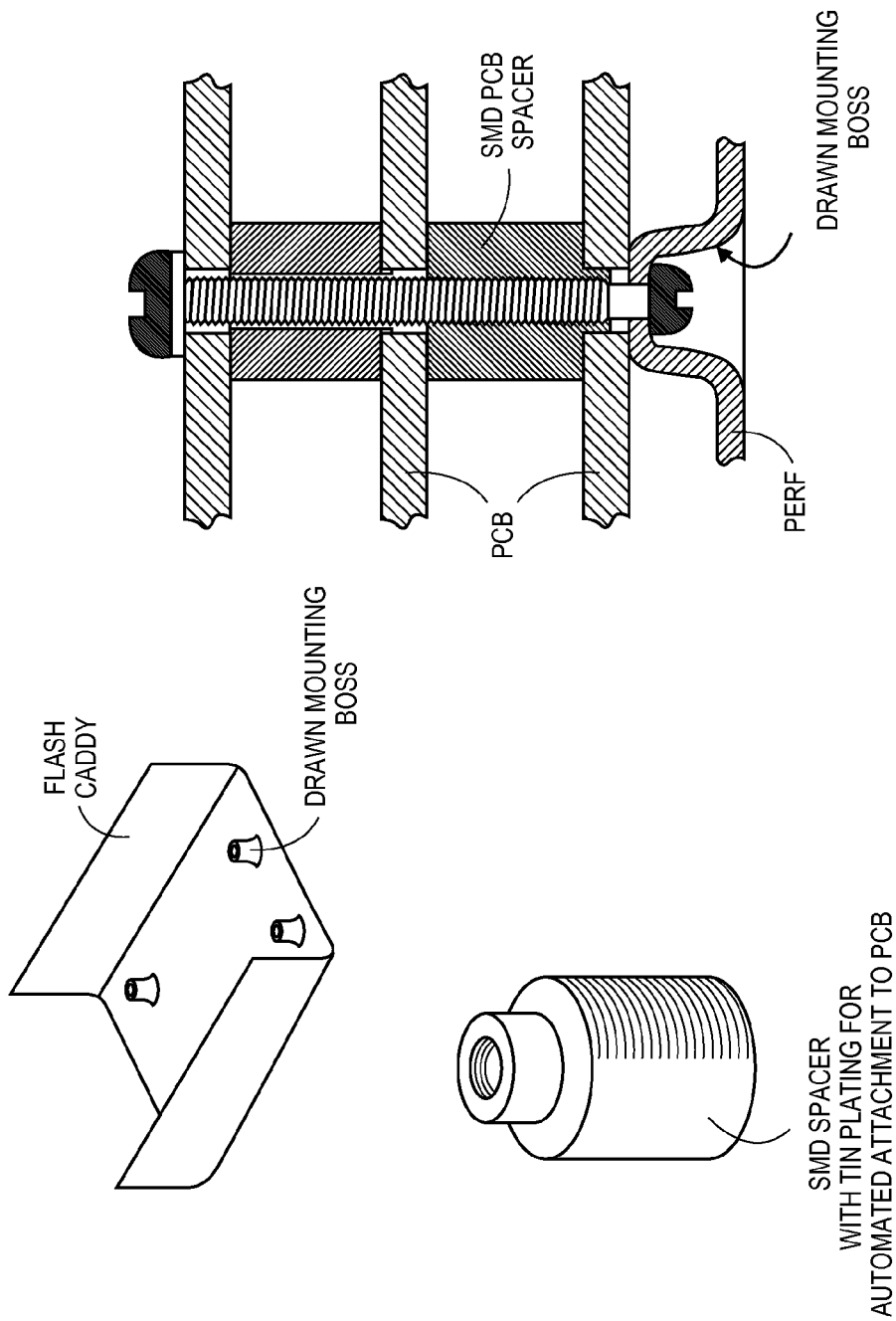
FIG. 4 is an illustration of an example of techniques for using a spacer to mount a plurality of NVM PCBs according to an embodiment of the invention.

FIG. 4 illustrates an example of techniques for using a specially designed spacer to mount, such as via Surface Mount Technology (SMT), a plurality of NVM PCBs. In some embodiments, the spacer simplifies joining of multiple NVM PCBs one to another and optionally to a caddy, such as a flash caddy. The spacer illustrated in FIG. 4 may be constructed using a variety of different materials. In an embodiment, the spacer may have tin plating on its exterior. The spacer of FIG. 4 allows NVM PCBs to be securely mounted in a substantially parallel fashion. The spacers of FIG. 4 also prevent the NVM PCBs from becoming dislocated if the NVM PCBs receive a mechanical shock as they firmly and securely maintain the NVM PCBs equidistant from each other.

Figure 5:
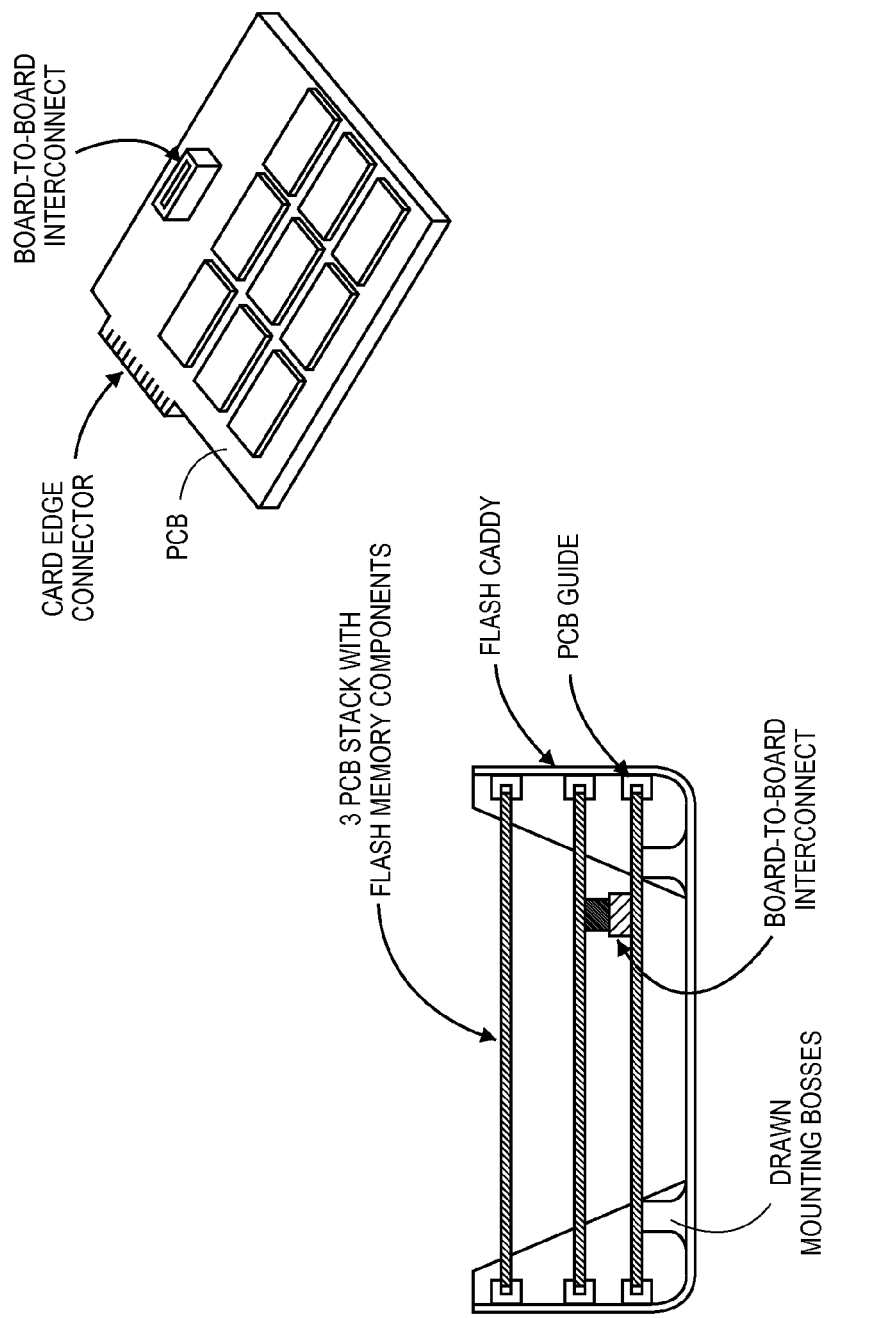
FIG. 5 is an illustration integrating one or more NVM PCBs into a flash caddy with PCB guides and formed bosses according to an embodiment of the invention.

FIG. 5 illustrates an example of techniques in which one or more NVM PCBs are integrated into a flash caddy with PCB guides and formed bosses. The NVM PCBs are optionally interconnected, such as with a board-to-board interconnect (for example, the spacer illustrated in FIG. 4) or a backplane interconnect, thereby reducing part count and/or minimizing space required to house the NVM PCBs. In the upper right hand corner, provision for board-to-board interconnection is illustrated via several techniques. For example, a card edge connector enables communication through a backplane and/or the board-to-board interconnect enables the daisy chain connection of two or more of the NVM PCBs.

FIG. 6 illustrates an example of a rack-mounted chassis including a plurality of disk bays (such as disk bay 610). The rack-mounted chassis (A in FIG. 6) includes a motherboard (C in FIG. 6), such as a PC motherboard. The motherboard has a PCI Express bus with connectors into which a PCI card (D in FIG. 6) is installed. The PCI card (for example, card 393 in FIG. 2C or FIG. 2D) is coupled to a backplane (B in FIG. 6), such as via a cable, for example 133' as illustrated in FIG. 2C or 2D). The backplane is configured so that NVM PCBs (such as flash memory cards, E in FIG. 6) or a battery back-up card (G in FIG. 6) inserted into disk bays of the rack-mounted chassis are coupled to each other and/or to the PCI card via the backplane. The flash memory cards are optionally installed in a flash caddy (F in FIG. 6, similar to the flash caddy illustrated in FIG. 3 or to the flash caddy illustrated in FIG. 5). The flash memory cards assembled in the flash caddy are illustrated as H in FIG. 6. In some embodiments, the flash caddy is permanently installed within a disk bay, such as with screws to chassis metal. In other embodiments, the flash caddy slides into the disk bay and the flash caddy is removable. A removable flash caddy is optionally locked into place by snaps, screws, and/or other attachment systems.

FIG. 7 illustrates the accessibility of at least some of a plurality of disk bays in a rack-mounted chassis according to an embodiment. The rack-mounted chassis (A in FIG. 7) includes an optional removable bezel (B in FIG. 7) having a hinged door (C in FIG. 7) providing access to at least some of the disk bays.

Many embodiments are possible. Not all of these features need to be present in all embodiments, and many variations and sub-combinations of these features are contemplated by the inventor. The invention could be implemented in hardware, such as hardware logic gates and/or mechanical hardware, by a programmable processor either using firmware, software, or other code, or various combinations.

While the description above has used flash memory as an example, the techniques herein are applicable to any type of solid-state memory, such as NVRAM, FRAM, PRAM, or DRAM.

Embodiments of the invention may partition functions of a processing node and/or the non-volatile, solid-state storage system and/or a memory sub-system in a variety of fashions. In an embodiment, the processing node uses different types of CPUs, different peripherals, and/or different interfaces. In a different embodiment, the non-volatile, solid-state storage system includes one or more memory sub-systems and/or one or more cards (such as PCI Express cards) for coupling the one or more memory sub-systems to the CPU complex.

Embodiments of the invention may physically partition components of a processing node and/or the non-volatile, solid-state storage system and/or a memory sub-system differently. In one example, some or all of the non-volatile, solid-state storage system is located in disk bays of the processing node. In another example, a battery back-up is located in disk bays of the processing node and/or on a PCI Express card and/or on a motherboard. As another example, a first one of the flash memory cards is plugged into a PCI Express bus slot, and others of the flash memory cards are located in the disk bays of the processing node.

There are many ways of providing storage of electrical power in a battery back-up system. For example, the battery back-up system may include one or more of (a) a rechargeable battery, (b) a lithium-ion battery, (c) a lead-acid battery, (d) a capacitor, and (e) an ultra capacitor. Values can be inverted, offset, combined with other values, and manipulated in many ways using known mathematical properties. An inversion could be added to an XOR to generate an exclusive-NOR (XNOR), but this is simply a derivative of an XOR and within a family of XOR functions. Other logic tricks and manipulations are contemplated and considered to be within the scope of the invention.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-volatile, solid-state storage system, comprising:
  a plurality of flash memory cards, each flash memory card having flash memory devices mounted thereon, wherein the plurality of flash memory cards are arranged in a stack;
  a master card, configured to be mounted in a bus slot on a motherboard, wherein the master card enables the plurality of flash memory cards to each communicate over a single bus corresponding to the bus slot, and wherein the master card splits the single bus into a plurality of lanes to enable the plurality of flash memory cards to each communicate over a respective lane of the plurality of lanes; and
  a cable coupling the master card to the plurality of flash memory cards arranged in the stack;
  wherein the plurality of flash memory cards arranged in the stack includes:
  a first flash memory card electrically coupled to the master card via the cable to communicatively couple the first flash memory card to the single bus; and
  a second flash memory card, daisy chained to and distinct from the first flash memory card, wherein the second flash memory card is (a) directly electrically coupled to the first flash memory card, and (b) indirectly communicatively coupled to the master card via the first flash memory card.

2. The system of claim 1, wherein the bus slot is a PCI Express bus slot.

3. The system of claim 1, wherein the bus slot is a Hyper-Transport (HT) bus slot.

4. The system of claim 1, wherein the plurality of flash memory cards arranged in the stack includes a third flash memory card that is (a) coupled to the first flash memory card and (b) not cabled to the master card, wherein the third flash memory card is indirectly communicatively coupled to the master card via the first flash memory card.

5. The system of claim 1, further comprising:
a third flash memory card that is (a) directly electrically coupled to the second flash memory card and (b) indirectly communicatively coupled to the master card via the first flash memory card and the second flash memory card.

6. The system of claim 1, further comprising a battery back-up.

7. The system of claim 6, wherein the battery back-up is coupled to the first and second flash memory cards.

8. The system of claim 7, wherein:
the system is included in a rack-mounted computer system; and
the battery back-up is on a back-up board mounted within a flash caddy installed in a disk bay of the rack-mounted computer system, the battery back-up providing back-up power to two or more flash memory cards of the plurality of flash memory cards mounted within the flash caddy, the flash caddy for receiving the two or more flash memory cards of the plurality of flash memory cards.

9. The system of claim 1, wherein the system is included in a rack-mounted computer system and further comprises:
a flash caddy, installed in a disk bay of the rack-mounted computer system, for receiving two or more flash memory cards of the plurality of flash memory cards in a stacked arrangement, the flash caddy enabled to separately receive at least the first flash memory card and the second flash memory card.

10. The system of claim 9, wherein the flash caddy includes two or more sets of card guides to physically support two or more flash memory cards of the plurality of flash memory cards within the flash caddy, wherein a first set of card guides of the two or more sets of card guides is shaped to receive an edge of the first flash memory card and a second set of card guides of the two or more sets of card guides is shaped to receive an edge of the second flash memory card.

11. The system of claim 9, further comprising:
an inter-board interconnect on the first flash memory card for directly electrically coupling to the second flash memory card in the flash caddy.

12. The system of claim 11, wherein the inter-board interconnect forms a daisy chain connection between the first flash memory card and the second flash memory card.

13. The system of claim 1, wherein the master card is an active master card, wherein the active master card includes active circuitry for one or more of: processing, switching, routing, reformatting, and converting the single bus into the plurality of lanes to enable the plurality of flash memory cards to each communicate over a respective lane of the plurality of lanes.

14. An apparatus comprising:
a first flash memory card for storing information, wherein the first flash memory card has flash memory devices mounted thereon and includes:
a first interface for electrically coupling the first flash memory card via a cable to a master card mounted in a bus slot on a motherboard so as to communicatively couple the first flash memory card to a single bus corresponding to the bus slot, and wherein the master card splits the single bus into a plurality of lanes to enable the plurality of flash memory cards to each communicate over a respective lane of the plurality of lanes; and
a second interface for directly electrically coupling the first flash memory card to a second flash memory card that has flash memory devices mounted thereon, and is daisy chained to and distinct from the first flash memory card so as to indirectly communicatively couple the second flash memory card to the master card, wherein the first and second flash memory cards are two of a plurality of flash memory cards that are arranged in a stack.

15. The apparatus of claim 14, wherein the master card enables a plurality of flash memory cards, at least including the first flash memory and the second flash memory card, to each communicate over the single bus.

16. The apparatus of claim 14, wherein the bus slot is a PCI Express bus slot.

17. The system of claim 1, wherein the plurality of flash memory cards are arranged in the stack in a disk bay, and the first and second flash memory cards are interconnected within the disk bay using one of a board-to-board interconnect and a backplane interconnect.

* * * * *